US009181618B2

(12) United States Patent
Feldbaum et al.

(10) Patent No.: US 9,181,618 B2
(45) Date of Patent: Nov. 10, 2015

(54) MAGNETIC LAYER PATTERNING BY ION IMPLANTATION

(71) Applicant: Seagate Technology LLC, Cupertino, CA (US)

(72) Inventors: Michael Feldbaum, San Jose, CA (US); Koichi Wago, Sunnyvale, CA (US); David Kuo, Palo Alto, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/635,847

(22) Filed: Mar. 2, 2015

(65) Prior Publication Data

US 2015/0167155 A1 Jun. 18, 2015

Related U.S. Application Data

(62) Division of application No. 13/797,819, filed on Mar. 12, 2013.

(60) Provisional application No. 61/745,510, filed on Dec. 21, 2012.

(51) Int. Cl.
| | |
|---|---|
| *C23C 14/48* | (2006.01) |
| *G11B 5/84* | (2006.01) |
| *G11B 5/855* | (2006.01) |
| *C23C 14/06* | (2006.01) |
| *C23C 14/08* | (2006.01) |

(52) U.S. Cl.
CPC .............. *C23C 14/48* (2013.01); *C23C 14/0605* (2013.01); *C23C 14/08* (2013.01); *G11B 5/84* (2013.01); *G11B 5/8408* (2013.01); *G11B 5/855* (2013.01); *Y10T 428/24612* (2015.01)

(58) Field of Classification Search
None
See application file for complete search history.

(56) References Cited

U.S. PATENT DOCUMENTS

| 6,864,042 | B1 * | 3/2005 | Kuo et al. ................... 430/320 |
| 8,048,323 | B2 * | 11/2011 | Fukushima et al. .......... 216/22 |
| 8,535,766 | B2 * | 9/2013 | Verhaverbeke et al. ...... 427/526 |
| 8,551,578 | B2 * | 10/2013 | Nalamasu et al. ........... 427/526 |
| 8,986,557 | B2 * | 3/2015 | Underwood et al. .......... 216/22 |
| 9,064,521 | B1 * | 6/2015 | Dorsey ............................. 1/1 |
| 2012/0196155 | A1 * | 8/2012 | Bencher et al. ............... 428/836 |
| 2015/0069560 | A1 * | 3/2015 | Cho et al. ...................... 257/421 |

FOREIGN PATENT DOCUMENTS

JP 2011054254 A * 3/2011

* cited by examiner

*Primary Examiner* — Anita Alanko

(57) ABSTRACT

Provided herein is a method including conformally depositing a first layer over a patterned resist; depositing a second, thicker layer over the first layer; etching the second layer to expose the first layer; and patterning a magnetic layer by ion implantation in accordance with the patterned resist to form a patterned magnet layer.

20 Claims, 12 Drawing Sheets

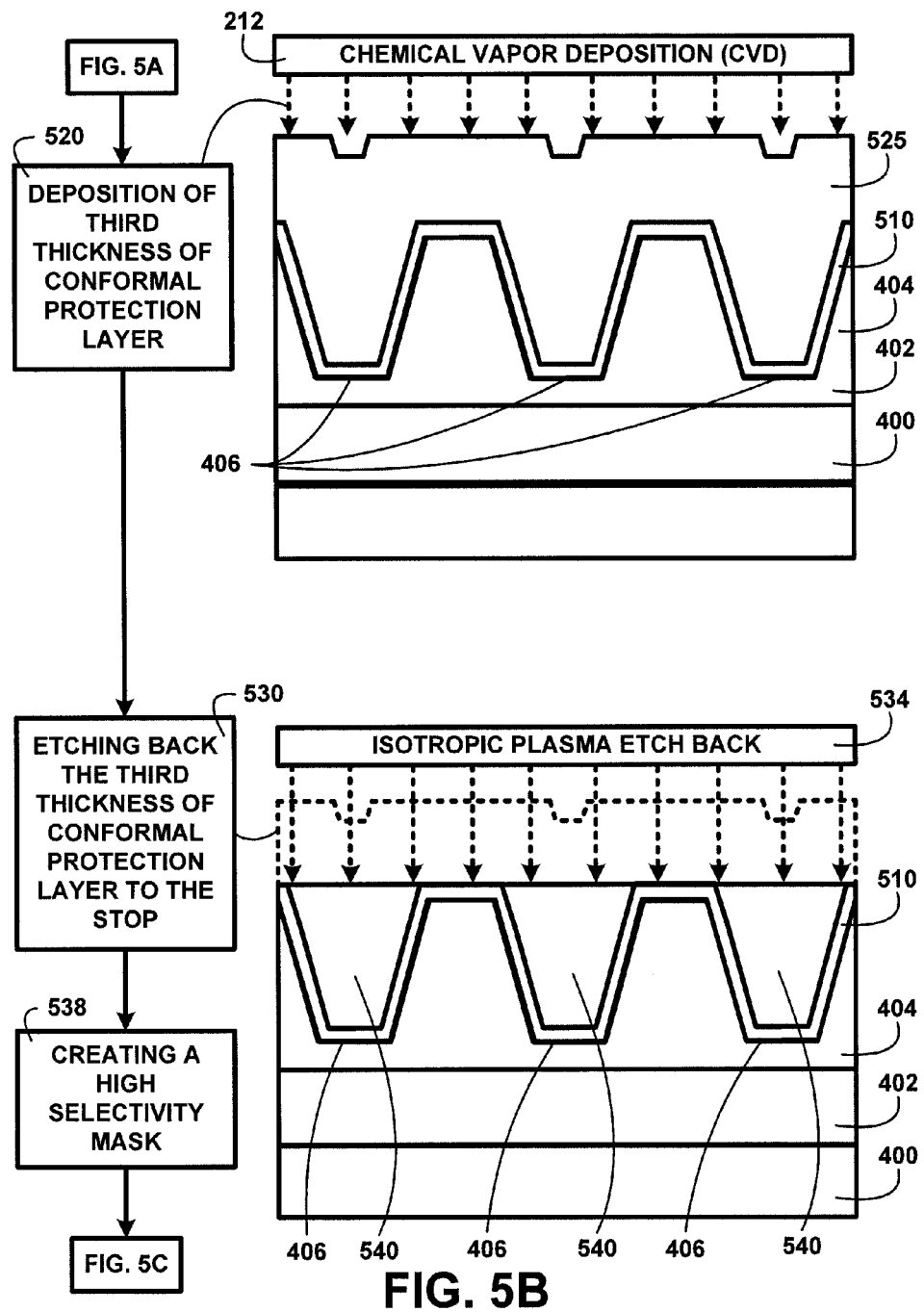

MAGNETIC LAYER PATTERNING BY ION IMPLANTATION

CROSS REFERENCE

This application is a division of U.S. patent application Ser. No. 13/797,819, filed Mar. 12, 2013, which claims the benefit of U.S. Provisional Patent Application No. 61/745,510, filed Dec. 21, 2012, each of which is incorporated herein by reference in its entirety.

BACKGROUND

Patterning of recording stacks may have side-effects including size deformation and feature position shifting in stacks including bit-patterned media (BPM) as feature densities have increased for example a density of 0.5 Teradots per square inch ($Td/in^2$) and above.

SUMMARY

Provided herein is a method including conformally depositing a first layer over a patterned resist; depositing a second, thicker layer over the first layer; etching the second layer to expose the first layer; and patterning a magnetic layer by ion implantation in accordance with the patterned resist to form a patterned magnet layer.

DRAWINGS

FIG. 5B shows for illustrative purposes only an example of a deposition of third thickness of conformal protection layer of one embodiment.

DESCRIPTION

In a following description, reference is made to the accompanying drawings, which form a part hereof, and in which is shown by way of illustration a specific example in which the invention may be practiced. It is to be understood that other embodiments may be utilized and structural changes may be made without departing from the scope of the present embodiments.

General Overview:

It should be noted that the descriptions that follow, for example, in terms of a method of magnetic media manufacturing is described for illustrative purposes and the underlying system can apply to any number and multiple types of stacks. In one embodiment, the conformal protection layer can be configured using a first thickness of conformal protection layer materials. The conformal protection layer can be configured to include a sacrificial layer of a second thickness of conformal protection layer materials and can be configured to include a third thickness of conformal protection layer materials of one embodiment.

Figure 1:
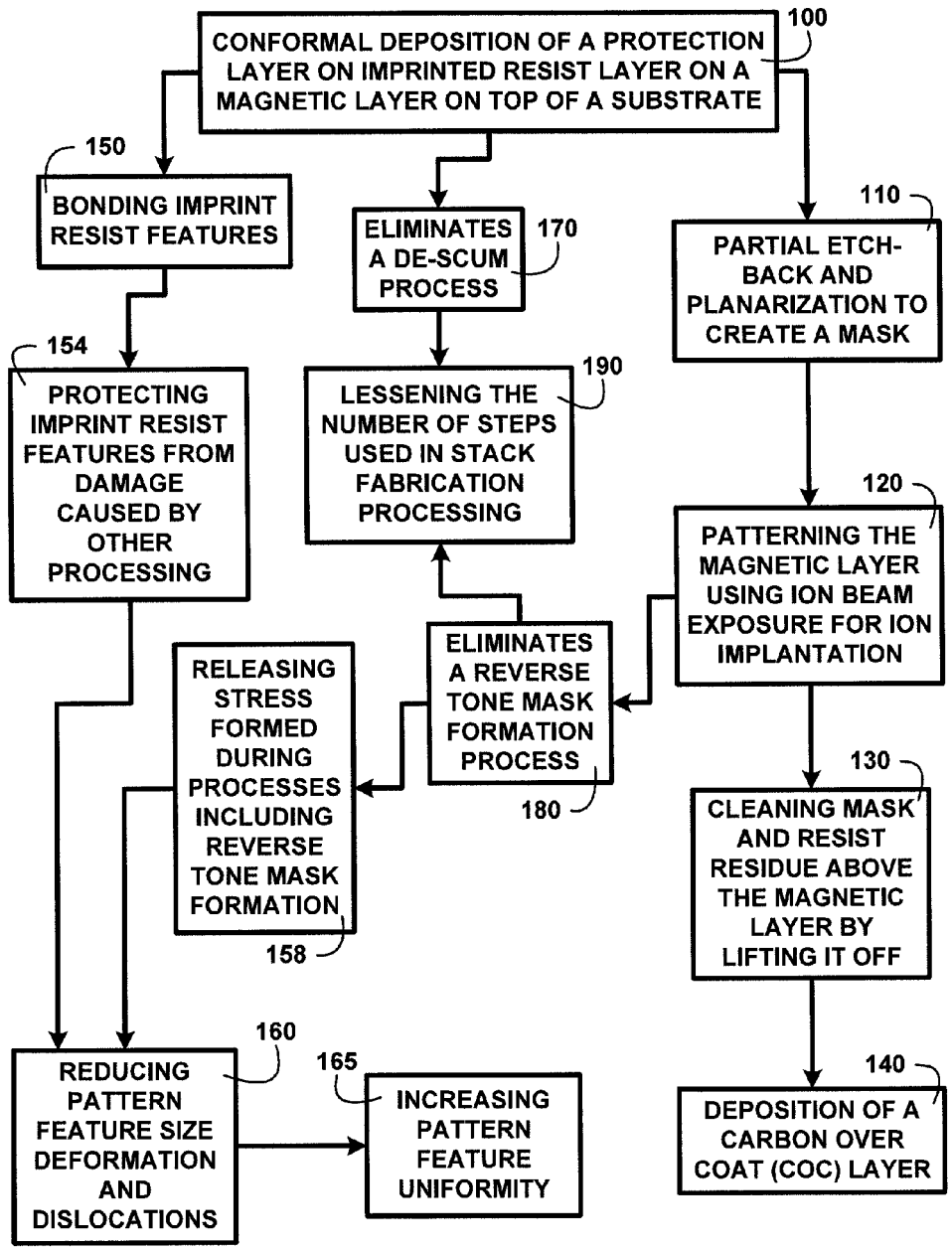
FIG. 1 shows a block diagram of an overview of a method of magnetic media manufacturing of one embodiment.

FIG. 1 shows a block diagram of an overview of a method of magnetic media manufacturing of one embodiment. FIG. 1 shows a conformal deposition of a protection layer on imprinted resist layer on a magnetic layer on top of a substrate 100. The conformal deposition of a protection layer on imprinted resist layer on a magnetic layer on top of a substrate 100 is processed using a partial etch-back and planarization to create a mask 110. The mask is used for patterning the magnetic layer by ion beam exposure for ion implantation 120. Cleaning mask residue above the magnetic layer by lifting it off 130 prepares the patterned magnetic layer for a deposition of a carbon over coat (COC) layer 140 of one embodiment.

The conformal deposition of a protection layer on imprinted resist layer on a magnetic layer on top of a substrate 100 is used for bonding imprint resist features 150 and protecting imprint resist features from damage caused by other processing 154 and eliminates a de-scum process 170. The partial etch-back and planarization to create a mask 110 eliminates a reverse tone mask formation process 180 releasing stress formed during processes including reverse tone mask formation 158. Lessening the number of steps used in stack fabrication processing 190 and using the conformal protection layer created mask is used for reducing pattern feature size deformation and dislocations 160 thereby increasing pattern feature uniformity 165 in patterned stacks including bit patterned media (BPM) including BPM with pattern densities greater than 0.5 Teradots per square inch ($Td/in^2$) of one embodiment.

DETAILED DESCRIPTION

Figure 2A:
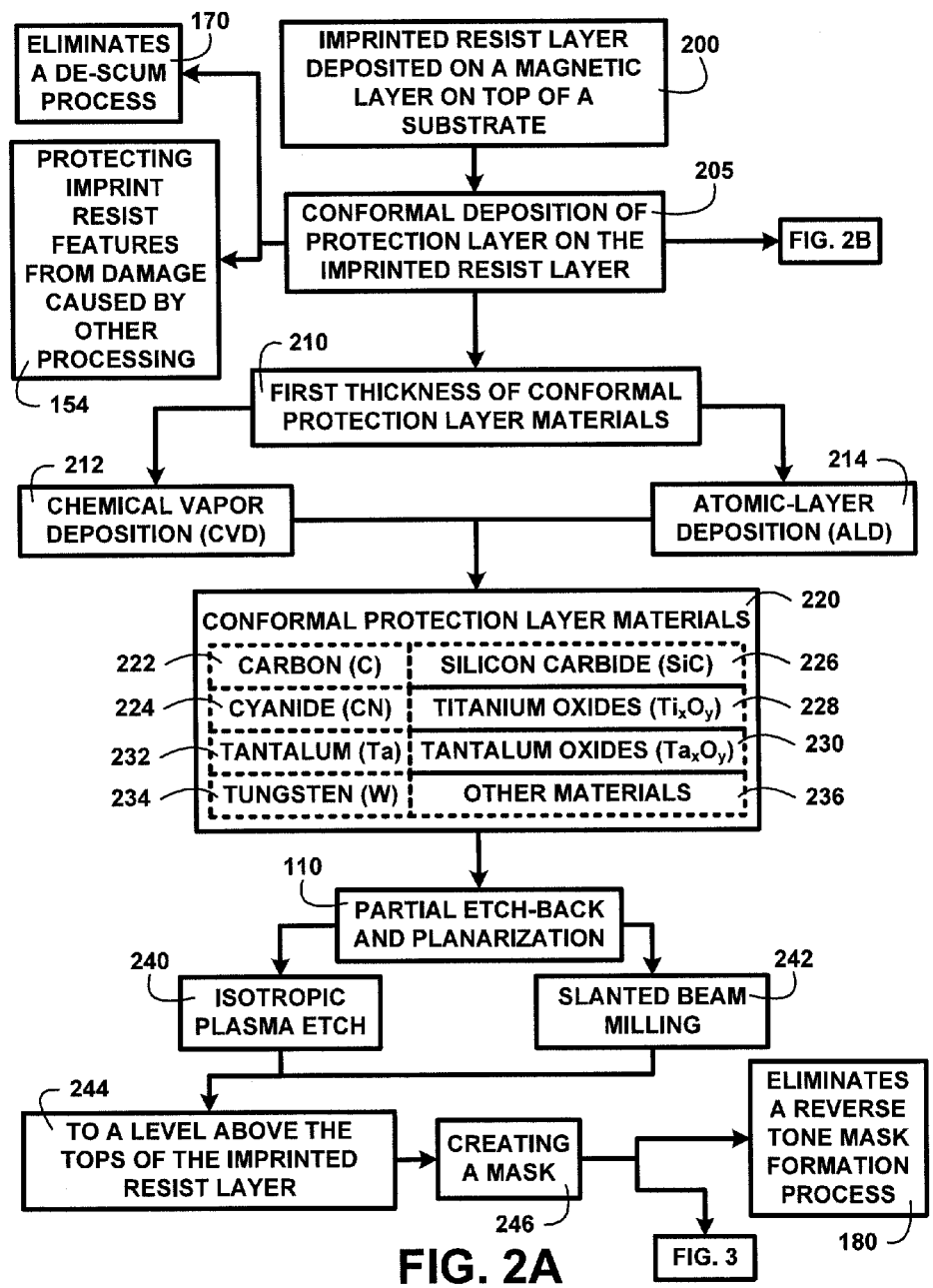
FIG. 2A shows a block diagram of an overview flow chart of a method of magnetic media manufacturing of one embodiment.

FIG. 2A shows a block diagram of an overview flow chart of a method of magnetic media manufacturing of one embodiment. FIG. 2A shows an imprinted resist layer deposited on a magnetic layer on top of a substrate 200. A conformal deposition of protection layer on the imprinted resist layer 205 eliminates a de-scum process 170. The conformal deposition of protection layer on the imprinted resist layer 205 and is used for protecting imprint resist features from damage caused by other processing 154 by bonding imprint resist features 150 of FIG. 1. In one embodiment a first thickness of conformal protection layer materials 210 is deposited on the imprinted resist layer including using chemical vapor deposition (CVD) 212 and atomic-layer deposition (ALD) 214. Conformal protection layer materials 220 include for example carbon (C) 222, cyanide (CN) 224, silicon carbide (SiC) 226, titanium oxides ($Ti_xO_y$) 228, tantalum oxides ($Ta_xO_y$) 230, tantalum (Ta) 232, tungsten (W) 234 and other materials 236 of one embodiment.

Figure 3:
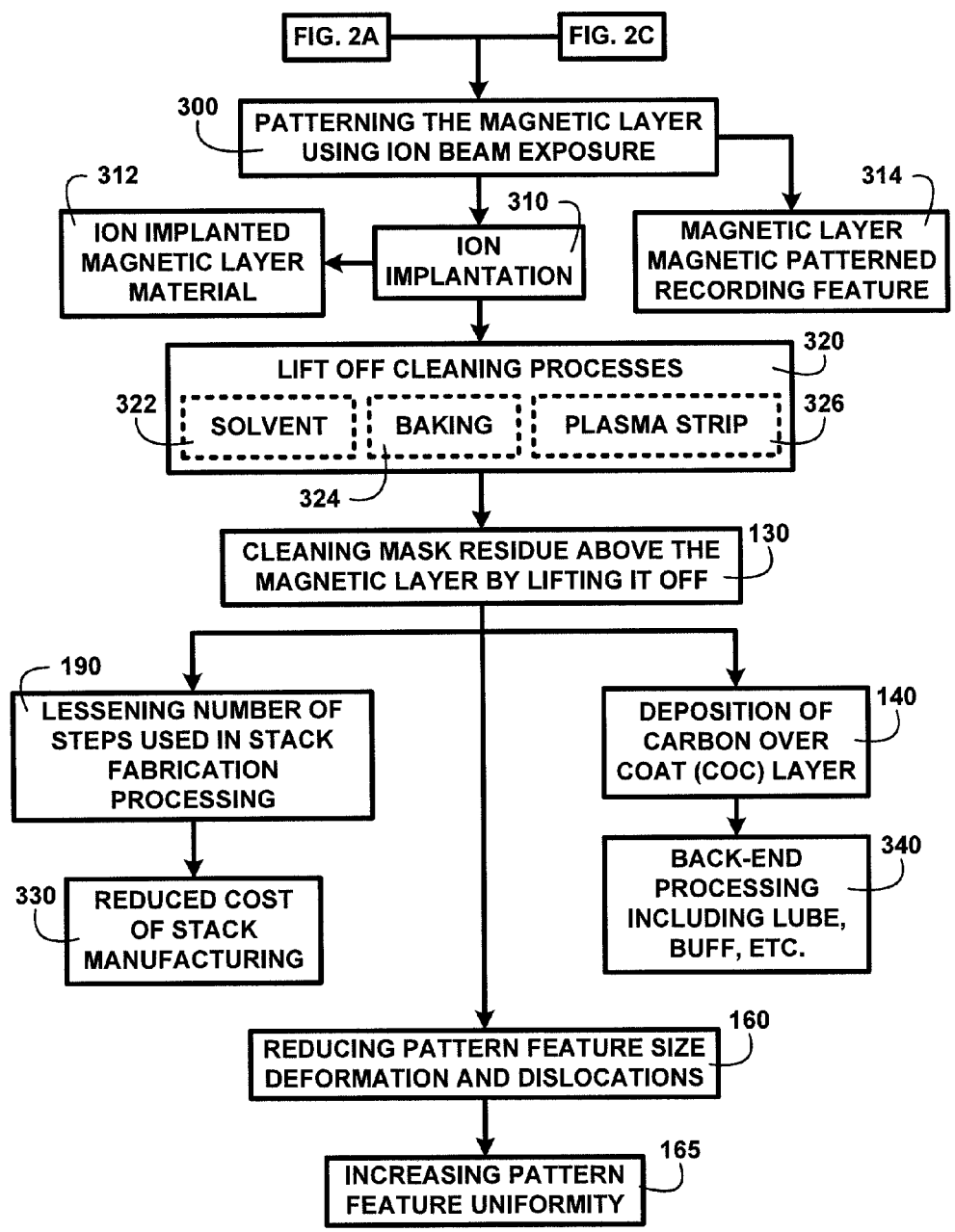
FIG. 3 shows a block diagram of an overview flow chart of patterning the magnetic layer of one embodiment.

The first thickness of conformal protection layer materials 210 is processed using a partial etch-back and planarization 110 including an isotropic plasma etch 240 and slanted beam milling 242 to a level above the tops of the imprinted resist layer 244 creating a mask 246. Creating a mask 246 eliminates a reverse tone mask formation process 180. Processing description continue as shown in FIG. 3 of one embodiment.

Figure 2B:
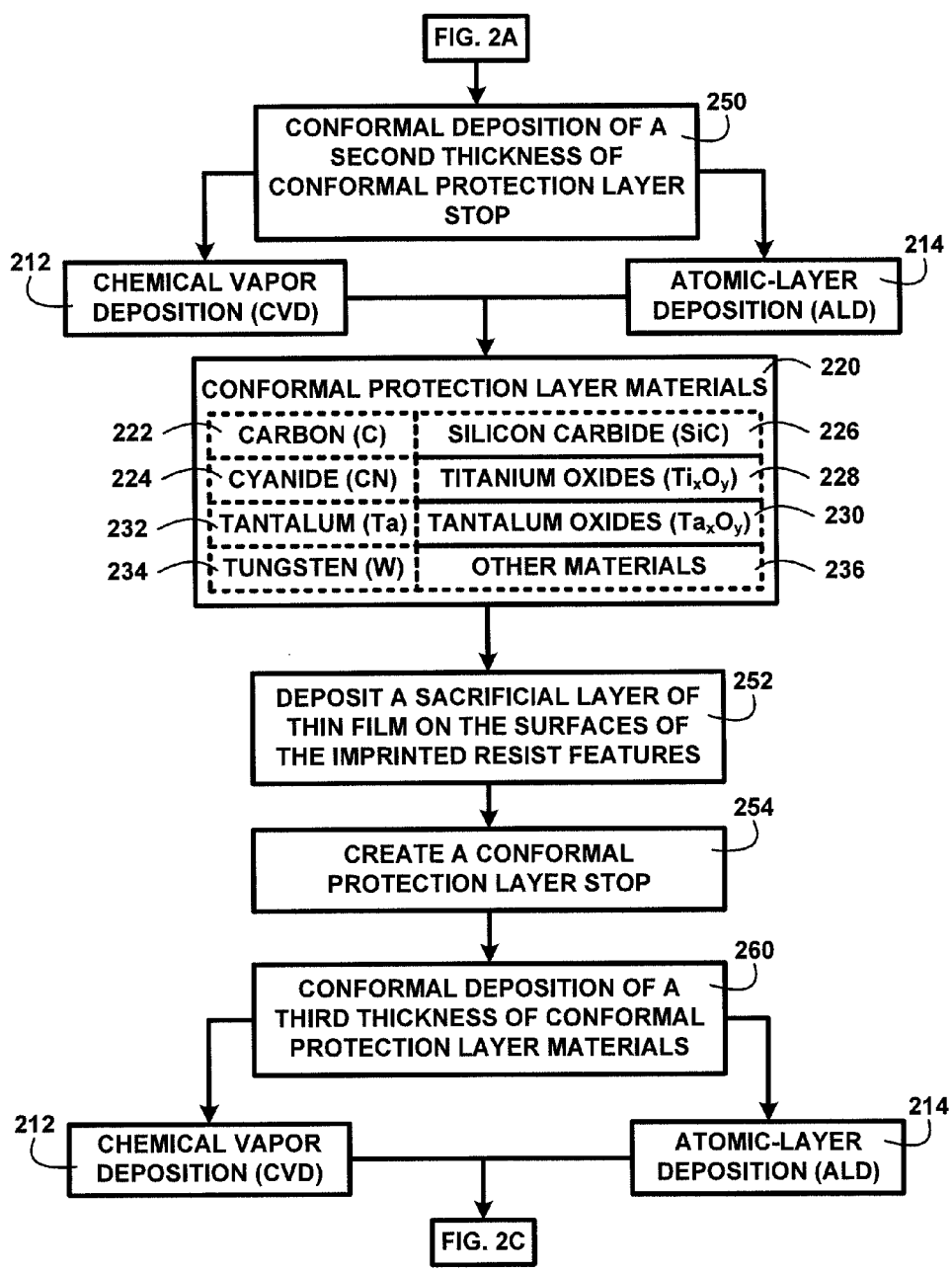
FIG. 2B shows a block diagram of an overview flow chart of fabricating a conformal protection layer stop of one embodiment.

Conformal Protection Layer Stop:

FIG. 2B shows a block diagram of an overview flow chart of fabricating a conformal protection layer stop of one embodiment. FIG. 2B shows another embodiment continuing from FIG. 2A including a conformal deposition of a second thickness of conformal protection layer stop 250. The conformal deposition of a second thickness of conformal protection layer stop 250 includes using chemical vapor deposition (CVD) 212 and atomic-layer deposition (ALD) 214. The conformal protection layer materials 220 include for example carbon (C) 222, cyanide (CN) 224, silicon carbide (SiC) 226, titanium oxides ($Ti_xO_y$) 228, tantalum oxides ($Ta_xO_y$) 230, tantalum (Ta) 232, tungsten (W) 234 and other materials 236. The conformal deposition of a second thickness of conformal protection layer stop 250 is used to deposit a sacrificial layer of thin film on the surfaces of the imprinted resist features 252 to create a conformal protection layer stop 254. A conformal deposition of a third thickness of conformal protection layer materials 260 using chemical vapor deposition (CVD) 212 and atomic-layer deposition (ALD) 214. Continuing processes are further described in FIG. 2C of one embodiment.

Figure 2C:
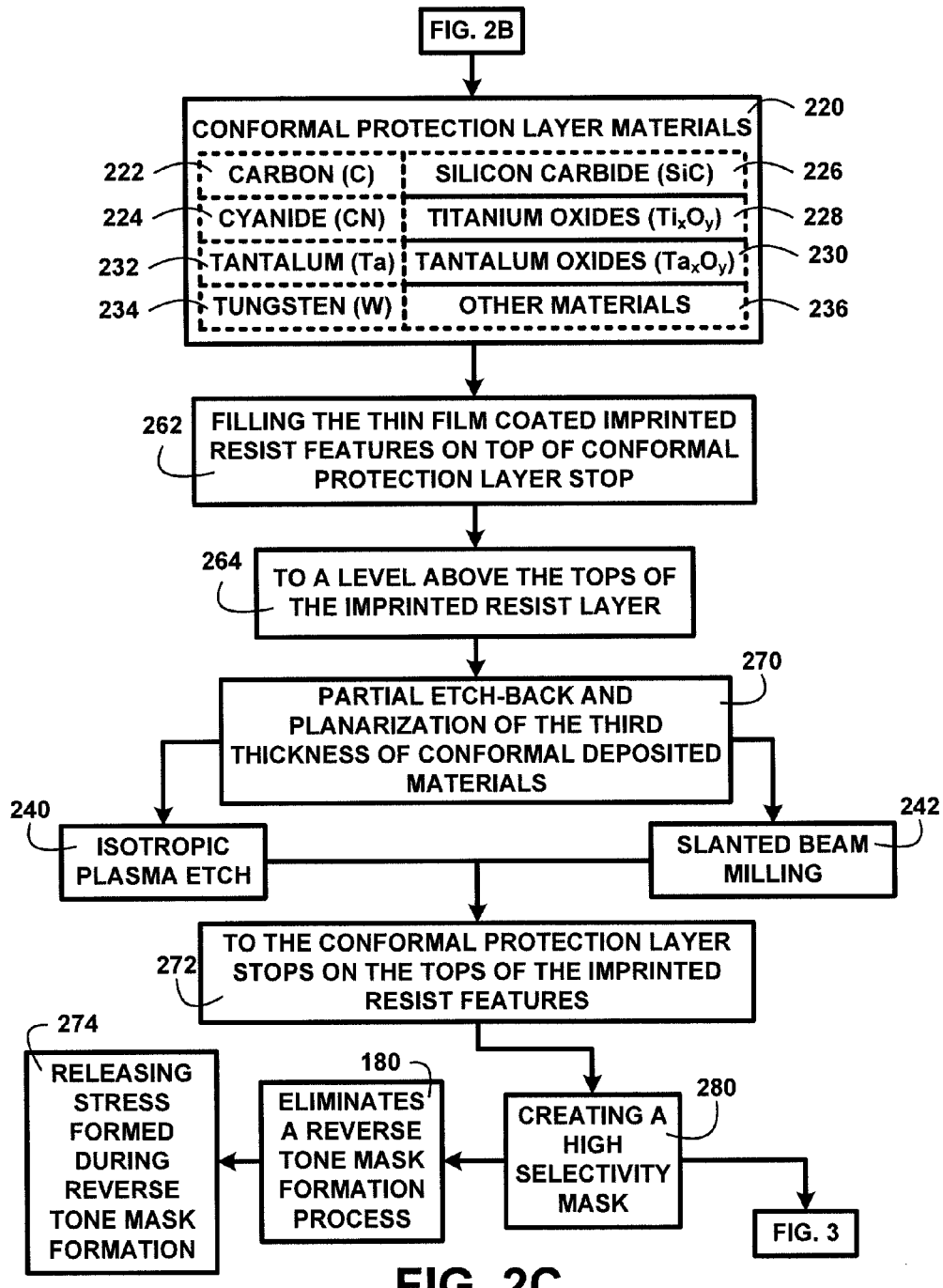
FIG. 2C shows a block diagram of an overview flow chart of the fabrication of a high selectivity mask of one embodiment.

High Selectivity Mask:

FIG. 2C shows a block diagram of an overview flow chart of the fabrication of a high selectivity mask of one embodiment. FIG. 2C shows a continuation from FIG. 2B wherein the conformal protection layer materials 220 include for example carbon (C) 222, cyanide (CN) 224, silicon carbide (SiC) 226, titanium oxides ($Ti_xO_y$) 228, tantalum oxides ($Ta_xO_y$) 230, tantalum (Ta) 232, tungsten (W) 234 and other materials 236. The conformal deposition of a third thickness of conformal protection layer materials 260 of FIG. 2B is filling the thin film coated imprinted resist features on top of conformal protection layer stop 262 to a level above the tops of the imprinted resist layer 264.

A partial etch-back and planarization of the third thickness of conformal deposited materials 270 using processes including an isotropic plasma etch 240 and slanted beam milling 242 to the conformal protection layer stops on the tops of the imprinted resist features 272 creating a high selectivity mask 280. Creating a high selectivity mask 280 eliminates a reverse tone mask formation process 180 releasing stress formed during reverse tone mask formation 274. Further processing is described in FIG. 3 of one embodiment.

Patterning the Magnetic Layer:

FIG. 3 shows a block diagram of an overview flow chart of patterning the magnetic layer of one embodiment. FIG. 3 shows processes continuing from FIG. 2A and FIG. 2C including patterning the magnetic layer using ion beam exposure 300 to create ion implantation 310. Patterning the magnetic layer using ion beam exposure 300 that passes through the conformal protection layer mask and imprinted resist layer and using ion implantation 310 creates ion implanted magnetic layer materials 312 and magnetic layer magnetic patterned recording features 314. The magnetic layer magnetic patterned recording features 314 include for example patterned stack features including bit patterned media (BPM) including BPM with pattern densities greater than 0.5 Tera-dots per square inch ($Td/in^2$) of one embodiment.

Following ion implantation 310 cleaning mask and resist residue above the magnetic layer by lifting it off 130 includes using lift off cleaning processes 320 including solvent 322, baking 324 and plasma strip 326. The lift off cleaning processes 320 includes using solvent, baking and plasma strip processes separately or in combinations prior to a deposition of a carbon over coat (COC) layer 140. The deposition of carbon over coat (COC) layer protects the patterned magnetic layer during back-end processing including lube, buff, etc. 340.

Lessening the number of steps used in stack fabrication processing 190 produces reduced cost of stack manufacturing 330. The conformal protection layer protecting imprint resist features from damage caused by other processing 154 by bonding imprint resist features 150 of FIG. 1 is used for reducing pattern feature size deformation and dislocations 160 thereby increasing pattern feature uniformity 165 in patterned stacks of one embodiment.

Figure 4A:
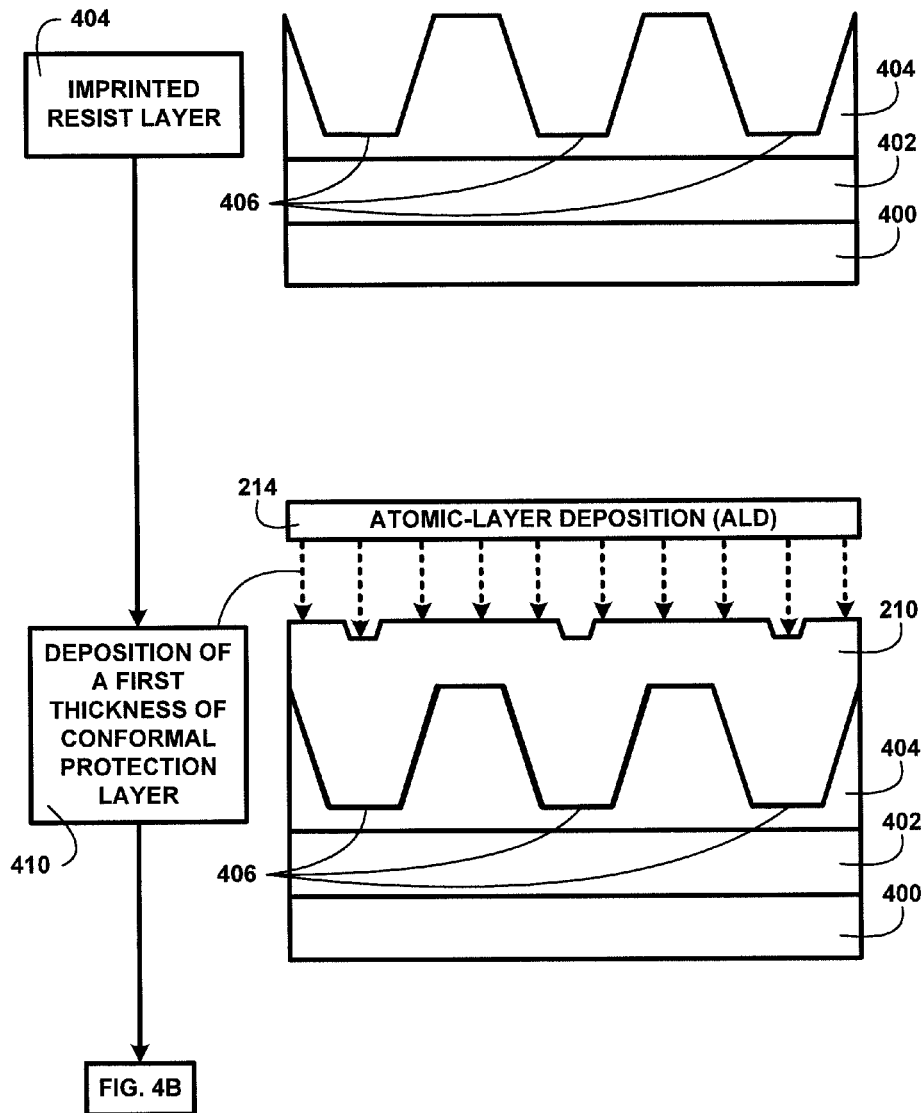
FIG. 4A shows for illustrative purposes only an example of a first thickness of conformal protection layer of one embodiment.

First Thickness of Conformal Protection Layer:

FIG. 4A shows for illustrative purposes only an example of a first thickness of conformal protection layer of one embodiment. FIG. 4A shows an imprinted resist layer 404 on top of a magnetic layer 402 deposited on a substrate 400. The magnetic layer 402 includes materials for example cobalt, chromium and platinum (CoCrPt). The substrate 400 includes materials for example quartz and silicon (Si). The imprinted resist layer 404 includes imprinted resist features 406. A deposition of a first thickness of conformal protection layer 410 is processed using atomic-layer deposition (ALD) 214. The deposition of a first thickness of conformal protection layer 410 is used to create the first thickness of conformal protection layer materials 210 on top of the imprinted resist features 406. Descriptions of continuing processes follow in FIG. 4B of one embodiment.

Figure 4B:
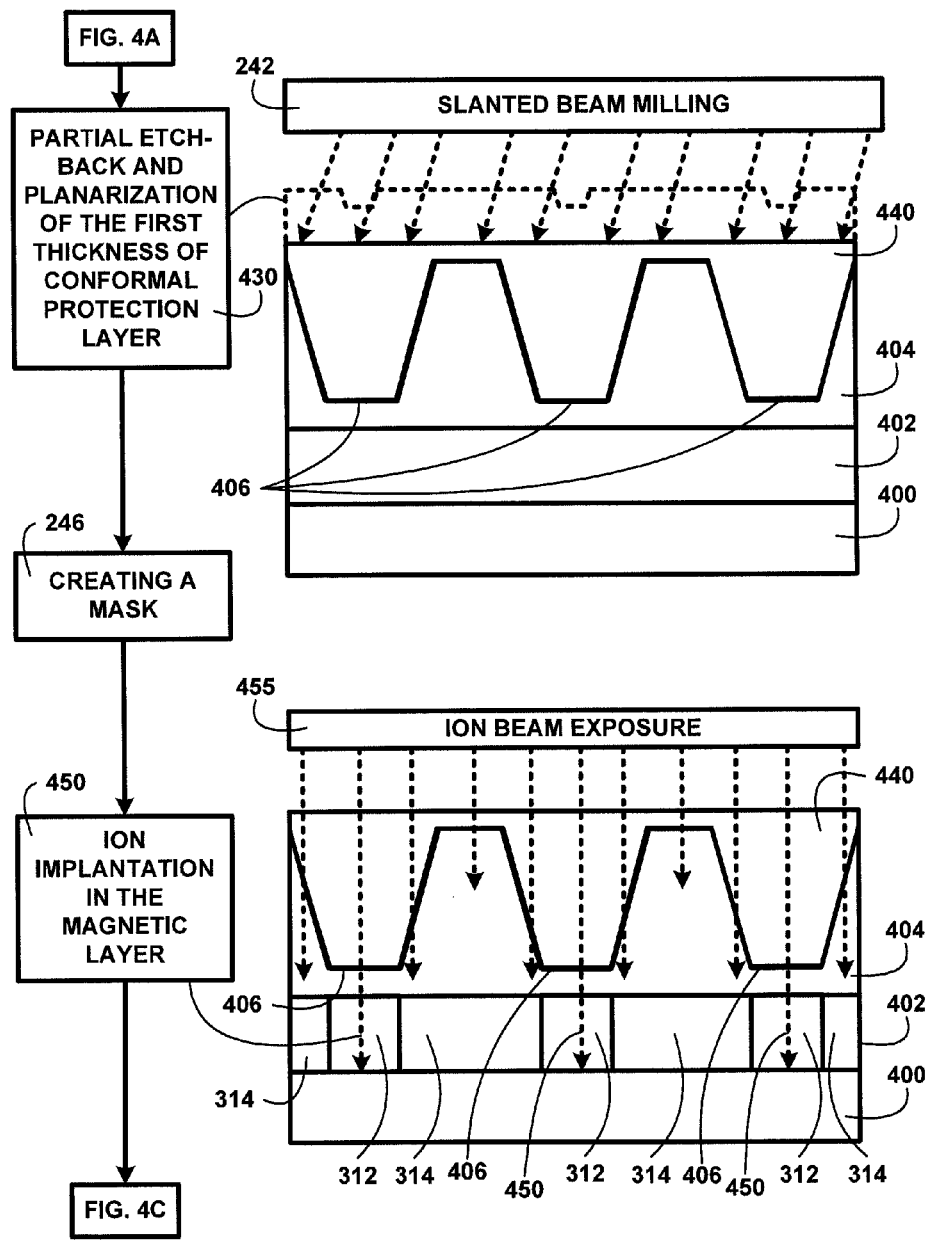
FIG. 4B shows for illustrative purposes only an example of a partial etch-back and planarization of conformal protection layer of one embodiment.

Partial Etch-Back and Planarization:

FIG. 4B shows for illustrative purposes only an example of a partial etch-back and planarization of conformal protection layer of one embodiment. FIG. 4B shows processes continuing from FIG. 4A including a partial etch-back and planarization of the first thickness of conformal protection layer 430. The partial etch-back and planarization of the first thickness of conformal protection layer 430 is performed using slanted beam milling 242 down to a level above the tops of the imprinted resist features 406. An etch-backed first thickness of conformal protection layer 440 is used for creating a mask 246 to transfer the patterns of the imprinted resist features 406 into the magnetic layer 402 deposited on the substrate 400 of one embodiment.

An ion implantation in magnetic layer 450 using ion beam exposure 455 is used to pattern the magnetic layer 402 using the imprinted resist features 406 and mask. The ion beam exposure 455 passes through the etch-backed first thickness of conformal protection layer 440 and imprinted resist features 406 into the magnetic layer 402 to the substrate 400. The ion beam exposure 455 is used for creating ion implanted magnetic layer materials 312 and magnetic layer magnetic patterned recording features 314 including for example dots in a bit patterned media (BPM) of one embodiment. The processing is further described in FIG. 4C.

Figure 4C:
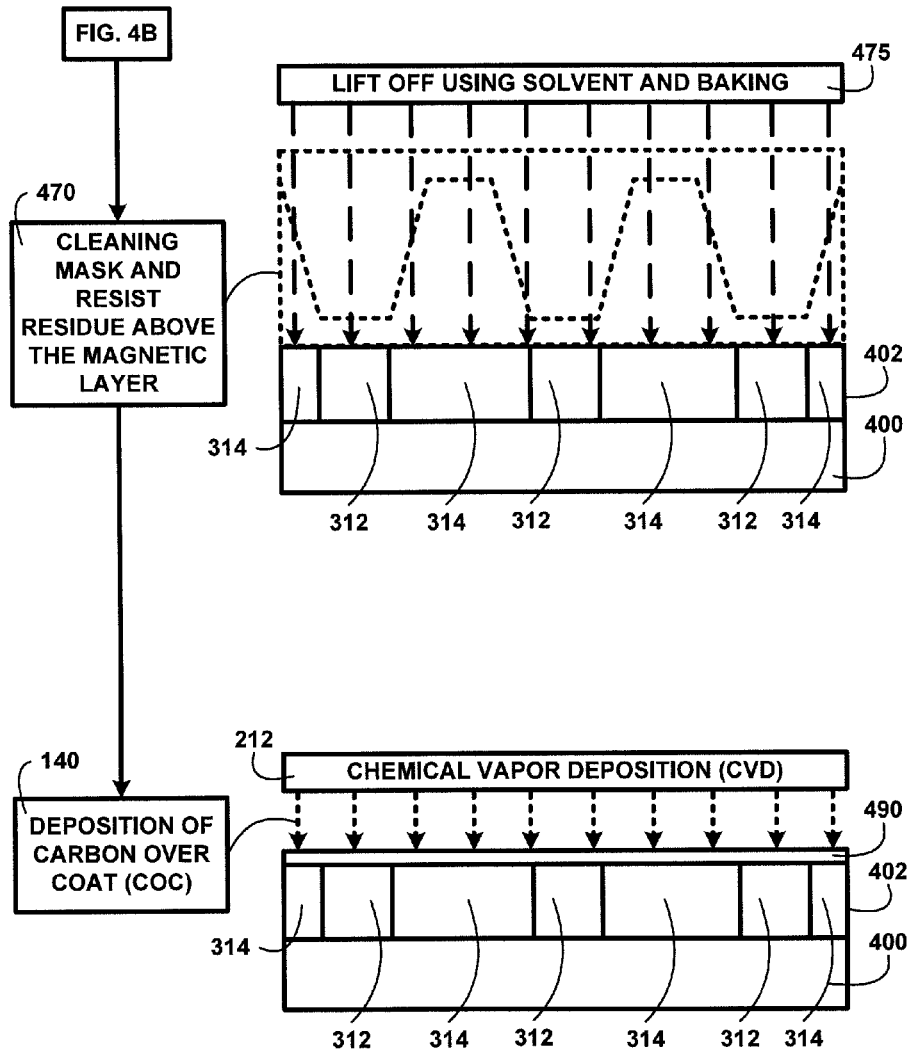
FIG. 4C shows for illustrative purposes only an example of lifting off mask residue of one embodiment.

Lifting Off Mask Residue:

FIG. 4C shows for illustrative purposes only an example of LIFTING OFF mask residue of one embodiment. FIG. 4C shows descriptions of processes that continue from FIG. 4B including cleaning mask and resist residue above the magnetic layer 470. Cleaning mask and resist residue above the magnetic layer 470 includes using a lift off using solvent and baking 475. The cleaning mask and resist residue above the magnetic layer 470 is exposing the ion implanted magnetic layer materials 312 and magnetic layer magnetic patterned recording features 314 in the magnetic layer 402 above the substrate 400.

The deposition of a carbon over coat (COC) layer 140 uses chemical vapor deposition (CVD) 212 in creating a COC protection layer 490. Creating a COC protection layer 490 is used for protecting the ion implanted magnetic layer materials 312 and magnetic layer magnetic patterned recording features 314 in the magnetic layer 402 above the substrate 400 prior to fabrication processes that follow of one embodiment.

Figure 5A:
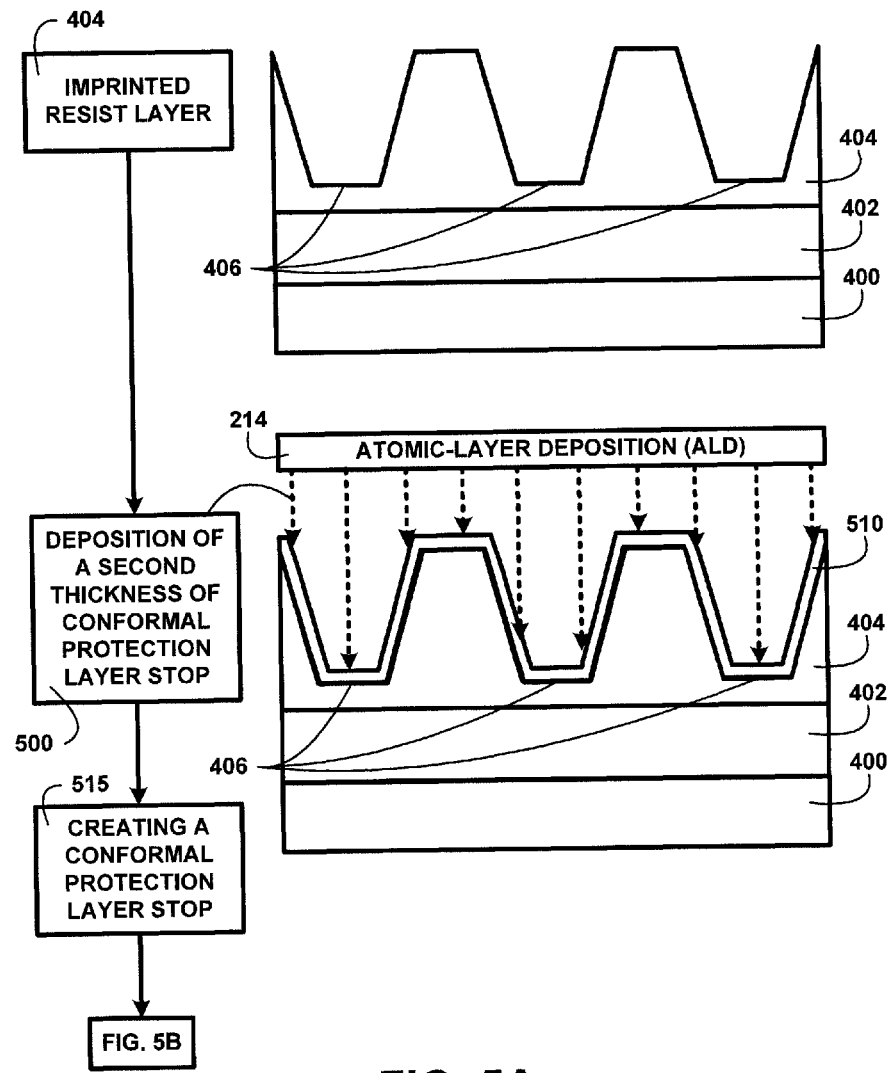
FIG. 5A shows for illustrative purposes only an example of a conformal protection layer stop of one embodiment.

Conformal Protection Layer Stop:

FIG. 5A shows for illustrative purposes only an example of a conformal protection layer stop of one embodiment. FIG. 5A shows the imprinted resist features 406 in the imprinted resist layer 404 on top of the magnetic layer 402 deposited on top of the substrate 400. A deposition of a second thickness of conformal protection layer stop 500 using atomic-layer deposition (ALD) 214 is creating a conformal protection layer stop 515. The deposition of a second thickness of conformal protection layer stop 500 is a thin film on the surfaces of the imprinted resist features 406. The conformal protection layer stop 510 is bonding imprint resist features 150 of FIG. 1 of one embodiment. A continuation of the processing is described in FIG. 5B.

Deposition of Third Thickness of Conformal Protection Layer:

FIG. 5B shows for illustrative purposes only an example of a deposition of third thickness of conformal protection layer of one embodiment. FIG. 5B shows a continuation from FIG. 5A that includes a deposition of third thickness of conformal protection layer 520 using the chemical vapor deposition (CVD) 212 on top of the conformal protection layer stop 510. The deposition of third thickness of conformal protection layer 520 is filling the thin film coated imprinted resist features 406 with a third thickness of materials to a level above the tops of the conformal protection layer stop 510 of one embodiment.

A process is used for etching back the third thickness of conformal protection layer to the stop 530 using an isotropic plasma etch back 534. The etching back to conformal protection layer stop 510 creates an etched back third thickness of conformal protection layer 540 used for creating a high selectivity mask 538. Creating a high selectivity mask 538 is used for transferring the imprinted resist features 406 of the imprinted resist layer 404 to the magnetic layer 402 deposited on the substrate 400 of one embodiment. The processing is further described in FIG. 5C.

Figure 5C:
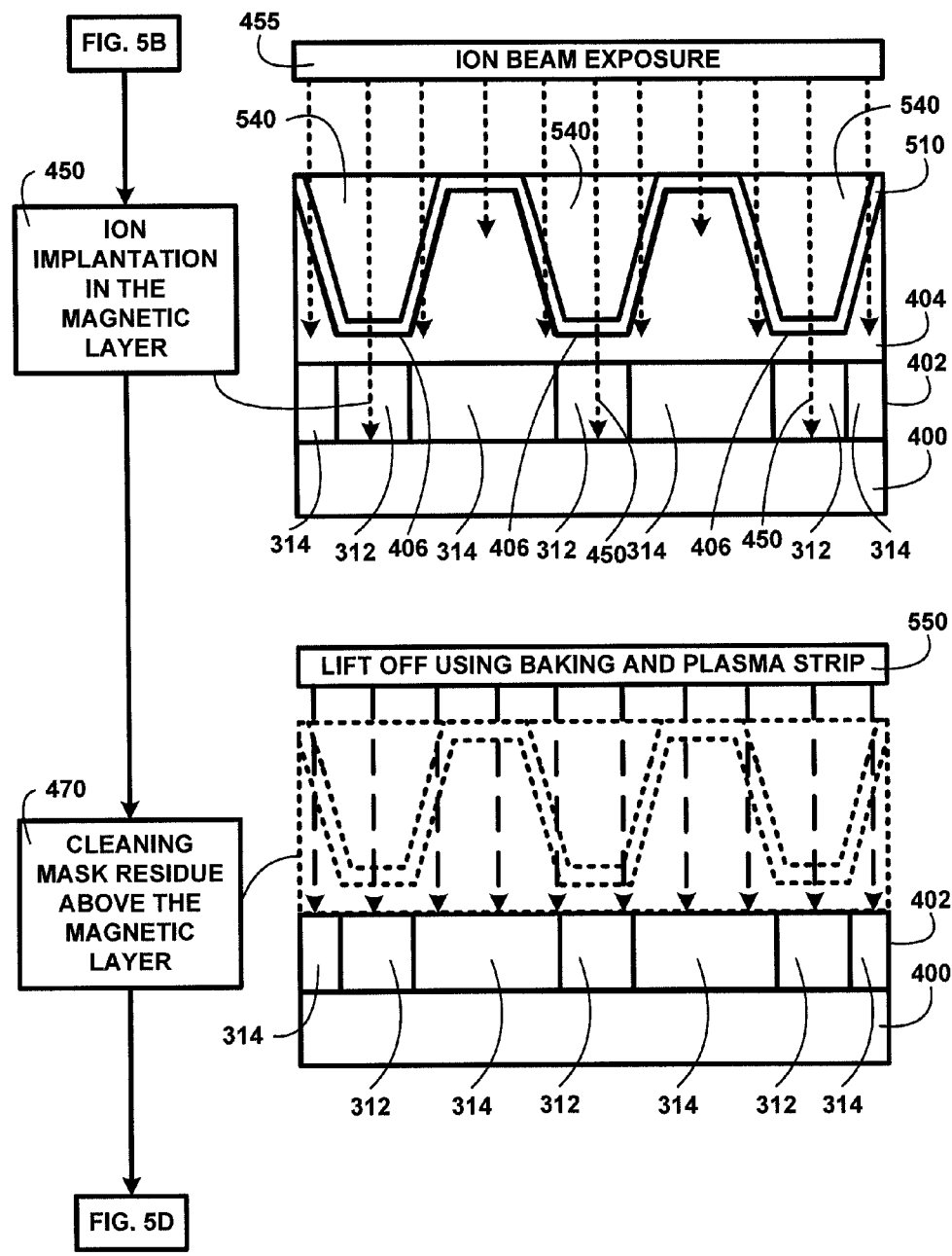
FIG. 5C shows for illustrative purposes only an example of ion beam exposure of one embodiment.

Ion Beam Exposure:

FIG. 5C shows for illustrative purposes only an example of ion beam exposure of one embodiment. FIG. 5C shows continued processing from FIG. 5B including the ion implantation in the magnetic layer 450 using the ion beam exposure 455 of the magnetic layer 402. The ion beam exposure 455 through the etched back third thickness of conformal protection layer 540, conformal protection layer stop 510 and imprinted resist layer 404 is used for patterning the magnetic layer 402 with the imprinted resist features 406 down to the substrate 400. The ion implantation in the magnetic layer 450 is creating ion implanted magnetic layer materials 312 and magnetic layer magnetic patterned recording features 314 for example dots in a bit patterned media (BPM) of one embodiment.

The cleaning mask and resist residue above the magnetic layer 470 using a lift off using baking and plasma strip 550 is removing the etched back third thickness of conformal protection layer 540, conformal protection layer stop 510 and imprinted resist layer 404. The cleaning mask and resist residue above the magnetic layer 470 is exposing the ion implanted magnetic layer materials 312 and magnetic layer magnetic patterned recording features 314 in the magnetic layer 402 of one embodiment. Descriptions of continuing processes are shown in FIG. 5D.

Figure 5D:
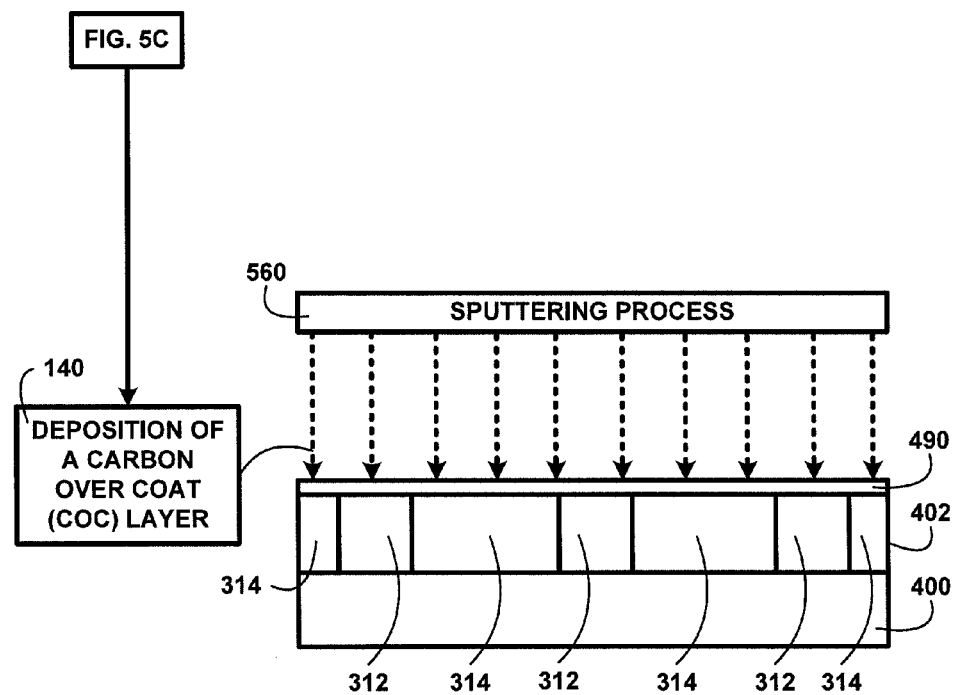
FIG. 5D shows for illustrative purposes only an example of conformal protection layer patterned magnetic layer recording features of one embodiment.

Patterned Magnetic Layer Recording Features:

FIG. 5D shows for illustrative purposes only an example of conformal protection layer patterned magnetic layer recording features of one embodiment. FIG. 5D shows processing continuing from FIG. 5C that includes the deposition of a carbon over coat (COC) layer 140. The deposition of a carbon over coat (COC) layer 140 includes using a sputtering process 560 on top of the magnetic layer 402 to protect the ion implanted magnetic layer materials 312 and magnetic layer magnetic patterned recording features 314 in the magnetic layer 402 on the substrate 400. The method of magnetic media manufacturing using the conformal protection layer high selectivity mask 538 is reducing pattern feature size deformation and dislocations 160 and increasing pattern feature uniformity 165 in patterned stacks including bit patterned media (BPM) including BPM with pattern densities greater than 0.5 Teradots per square inch ($Td/in^2$) of one embodiment.

The foregoing has described the principles, embodiments and modes of operation of the present embodiments. However, the invention should not be construed as being limited to the particular embodiments discussed. The above described embodiments should be regarded as illustrative rather than restrictive, and it should be appreciated that variations may be made in those embodiments by workers skilled in the art without departing from the scope of the present embodiments as defined by the following claims.

What is claimed is:

1. A method, comprising:
  conformally depositing a first layer over a patterned resist;
  depositing a second, thicker layer over the first layer;
  etching the second layer to expose the first layer; and
  patterning a magnetic layer by ion implantation in accordance with the patterned resist.

2. The method of claim 1, further comprising:
  imprinting a resist over the magnetic layer to form the patterned resist,
    wherein the first layer is deposited without descumming the patterned resist.

3. The method of claim 1,
  wherein patterning the magnetic layer by ion implantation implants ions in the magnetic layer between features in the patterned resist.

4. The method of claim 1,
  wherein the patterned resist is in overlying contact with the magnetic layer,
  wherein the first layer is in overlying contact with the patterned resist, and
  wherein the second layer is in overlying contact with the first layer.

5. The method of claim 1,
  wherein the first layer comprises C or $Ta_2O_5$.

6. The method of claim 1,
  wherein the second layer comprises Ta, W, or $Ta_2O_5$.

7. The method of claim 1,
  wherein the patterned resist, the first layer, and the second layer form a mask for patterning the magnetic layer.

8. The method of claim 7, further comprising:
  removing the mask by a lift-off process to expose a patterned magnetic layer.

9. The method of claim 8,
  wherein the patterned magnetic layer comprises a pattern of ion-implanted CoCrPt in CoCrPt free from implanted ions.

10. The method of claim 8, further comprising:
depositing a protective overcoat in overlying contact with the patterned magnetic layer.

11. A method, comprising:
conformally depositing a first layer over an imprinted resist;
depositing a second layer over the first layer,
wherein the second layer is thicker than the first layer;
etching the second layer to expose the first layer,
wherein the imprinted resist, the first layer, and the second layer form a mask; and
patterning a magnetic layer by ion implantation through the mask to form a patterned magnetic layer.

12. The method of claim 11, further comprising:
imprinting a resist over the magnetic layer to form the imprinted resist,
wherein the first layer is deposited without descumming the imprinted resist.

13. The method of claim 11,
wherein patterning the magnetic layer by ion implantation implants ions in the magnetic layer between features of the imprinted resist in the mask.

14. The method of claim 11,
wherein the first layer comprises C or $Ta_2O_5$,
wherein the second layer comprises Ta, W, or $Ta_2O_5$, and
wherein the patterned magnetic layer comprises a pattern of ion-implanted CoCrPt in CoCrPt free from implanted ions.

15. The method of claim 11, further comprising:
removing the mask by a lift-off process to expose the patterned magnetic layer, and
depositing a protective overcoat over the patterned magnetic layer.

16. A method, comprising:
conformally depositing a first layer in overlying contact with a resist comprising imprinted features;
depositing a second layer in overlying contact with the first layer,
wherein the second layer is thicker than the first layer;
etching the second layer to expose the first layer atop the imprinted features,
wherein the resist, the first layer, and the second layer form a mask; and
patterning a magnetic layer by ion implantation through the mask and between the imprinted features to form a patterned magnetic layer.

17. The method of claim 16, further comprising:
imprinting the resist to form the imprinted features in overlying contact with the magnetic layer.

18. The method of claim 16,
wherein the first layer is deposited without descumming the resist between the imprinted features.

19. The method of claim 16,
wherein the first layer comprises C or $Ta_2O_5$,
wherein the second layer comprises Ta, W, or $Ta_2O_5$, and
wherein the patterned magnetic layer comprises a pattern of ion-implanted CoCrPt in CoCrPt free from implanted ions.

20. The method of claim 16, further comprising:
removing the mask by a lift-off process to expose the patterned magnetic layer, and
depositing a carbon overcoat in overlying contact with the patterned magnetic layer.

\* \* \* \* \*